United States Patent
Horiuchi et al.

(10) Patent No.: US 6,921,674 B2
(45) Date of Patent: Jul. 26, 2005

(54) METHOD FOR MANUFACTURING A LIGHT EMITTING DIODE DEVICE

(75) Inventors: Megumi Horiuchi, Yamanashi-ken (JP); Takayoshi Michino, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 0 days.

(21) Appl. No.: 10/761,320

(22) Filed: Jan. 22, 2004

(65) Prior Publication Data

US 2004/0150335 A1 Aug. 5, 2004

Related U.S. Application Data

(62) Division of application No. 10/303,002, filed on Nov. 25, 2002, now Pat. No. 6,822,269.

(30) Foreign Application Priority Data

Nov. 26, 2001 (JP) .......................... 2001-360046

(51) Int. Cl.[7] ............................................. H01L 21/00
(52) U.S. Cl. .............................. 438/26; 438/25; 438/40; 438/113
(58) Field of Search ............................. 438/26, 25, 33, 438/34, 38, 39, 40, 42, 43, 113, 121, 124

(56) References Cited

U.S. PATENT DOCUMENTS 6,034,712 A * 3/2000 Iwasaki ...................... 347/241
6,483,101 B1 * 11/2002 Webster ..................... 250/216

* cited by examiner

*Primary Examiner*—Caridad M. Everhart
(74) *Attorney, Agent, or Firm*—Dennison, Schultz, Dougherty & MacDonald

(57) ABSTRACT

A light emitting diode device has a body having a recess. The body comprises a pair of half bodies made of metal, an insulation layer provided between the half bodies. An LED is mounted on a bottom of the recess and connected with the half bodies by bumps. The recess is closed by a transparent sealing plate.

4 Claims, 5 Drawing Sheets

METHOD FOR MANUFACTURING A LIGHT EMITTING DIODE DEVICE

This application is a division of Ser. No. 10/303,002, filed Nov. 25, 2002, now U.S. Pat. No. 6,822,269.

BACKGROUND OF THE INVENTION

The present invention relates to a light emitting diode (LED) device used in electronic devices such as a portable telephone.

FIG. 6 is a sectional view of a conventional LED device. The LED device 70 comprises a frame 71 made of resin and having a truncated cone recess 57, electrodes 72a and 72b embedded in the frame 71, and an LED 54 secured to the electrode 72a. The LED 54 is connected to the electrode 72b by a lead wire 55. The inside wall of the recess 57 is processed into a light reflection surface. The recess 57 is charged with a transparent resin 56 to seal the LED.

In the LED device 70, if moisture remains in the transparent resin 56, the frame 71 is cracked by expansion of the moisture caused by the heat of the reflow soldering. Furthermore, the transparent resin 56 contracts in dependency on the change of the atmospheric temperature. If the change repeats, lead wire 55 may be cut, which results in unreliableness of the device.

SUMMARY OF THE INVENTION

An object of the present invention is to provide a light emitting diode device.

According to the present invention, there is provided a light emitting diode device comprising a body having a recess, the body comprising a pair of half bodies made of metal, an insulation layer provided between the half bodies, an LED provided on a bottom of the recess, connecting means for connecting the LED with the half bodies, a sealing resin for sealing the connecting means and a transparent sealing plate for closing the recess.

The recess is formed into a semispherical shape or an inverted truncated cone.

The sealing plate has a convex lens, and the connecting means are bumps.

Furthermore, there is provided a method for manufacturing a light emitting diode device comprising the steps of preparing a body assembly having a plurality of LED device areas formed by pressing a metal plate, forming a recess in each of the LED areas, forming slits in areas arranged on a predetermined line except both side edges, charging a resin in each slit, mounting an LED on a bottom of the recess by bumps, charging a sealing resin under the LED, securing a transparent sealing plate on the body assembly, and dividing each area from the body assembly.

These and other objects and features of the present invention will become more apparent from the following detailed description with reference to the accompanying drawings.

DETAILED DESCRIPTION OF THE PREFERRED EMBODIMENT

Figure 1:
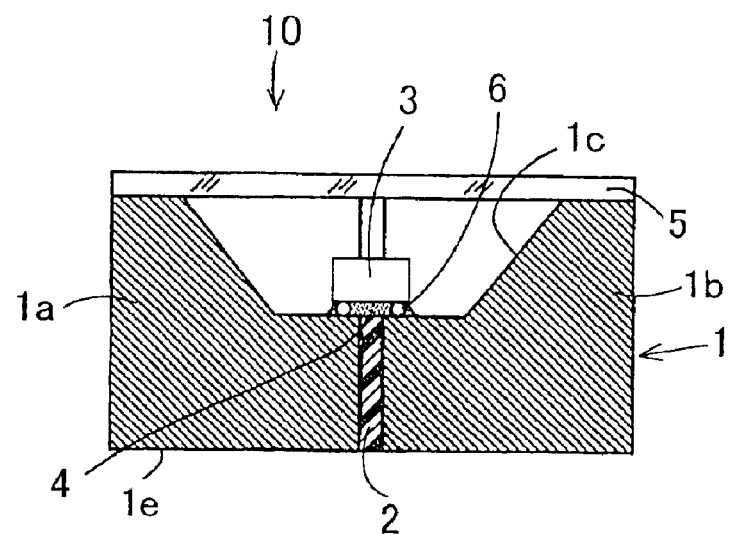
FIG. 1 is a sectional view of an LED device according to a first embodiment of the present invention.
Figure 2:
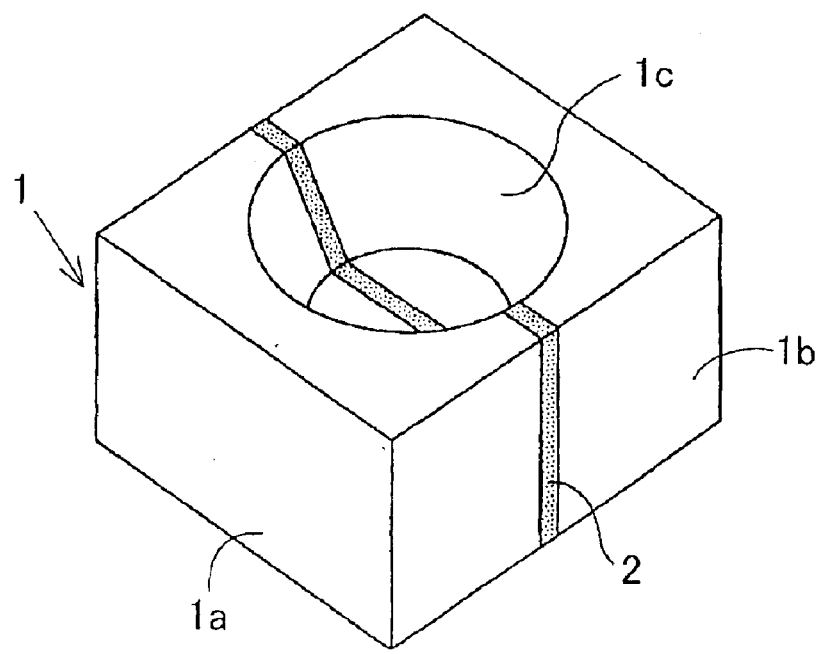
FIG. 2 is a perspective view of the LED device.

Referring to FIG. 1 showing the first embodiment of the present invention, the LED device 10 comprises a cubic body 1 made of metal having a high heat conductivity (higher than 50W/(m·K)) such as Mg group, Al group and Cu group, and having a recess 1c of an inverted truncated cone. The body 1 comprises a pair of first and second half bodies 1a and 1b, interposing an insulation layer 2 made of resin. An LED 3 is secured to the half bodies 1a and 1b by bumps 6, thereby connecting the LED 3 to a circuit through the half bodies 1a, 1b. The inside wall of the recess 1c is processed into a light reflection surface by silver plating. The underside of the LED 3 is sealed by a sealing resin 4 to increase resistance to shock and vibration, and to protect the bumps 6.

The recess 1c is closed by a transparent sealing plate 5 to protect the LED 3.

Next, the method for manufacturing the LED device 10 is described with reference to FIGS. 3a to 3f.

Figure 3A:
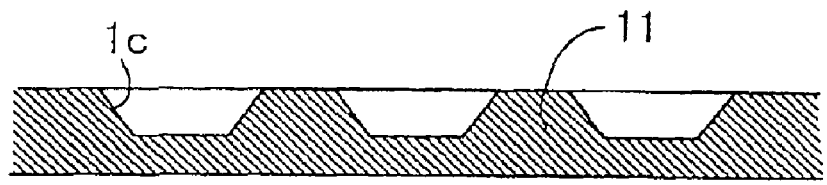
FIGS. 3a to 3f show a manufacturing method of the LED device.
Figure 3B:
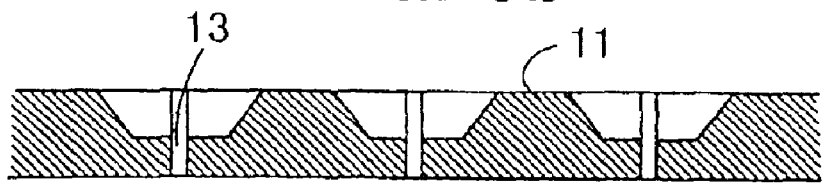
Figure 3C:
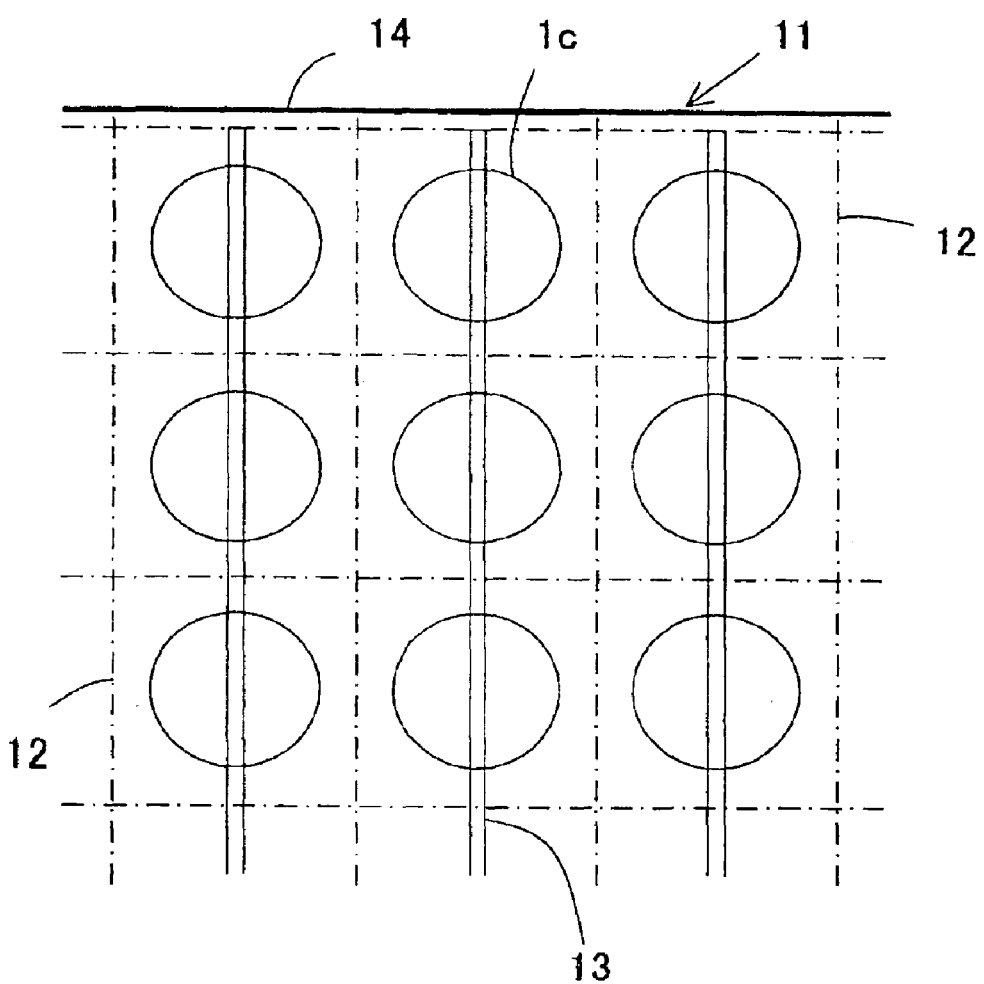
Figure 3D:
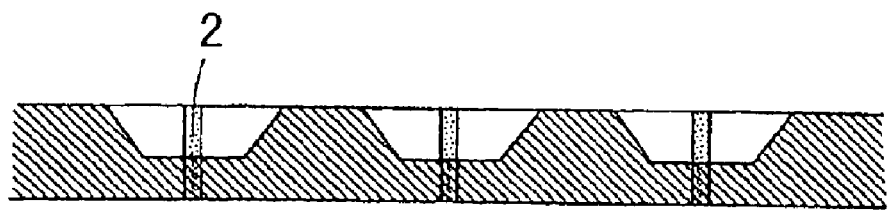

As shown in FIG. 3a, a body assembly 11 comprising a plurality of LED device areas 12 (FIG. 3c) is formed by pressing a metal plate. In each of the areas 12, the recess 1c is formed. Then, in areas 12 arranged on each lateral line, a slit 13 is formed without an edge 14 as shown in FIGS. 3b and 3c. Since the edge 14 is not cut, the body assembly 11 is not divided. In each slit 13, resin is charged to form the insulation layer 2 as shown in FIG. 3d. The wall of the recess 1c is processed into a reflection surface.

Figure 3E:
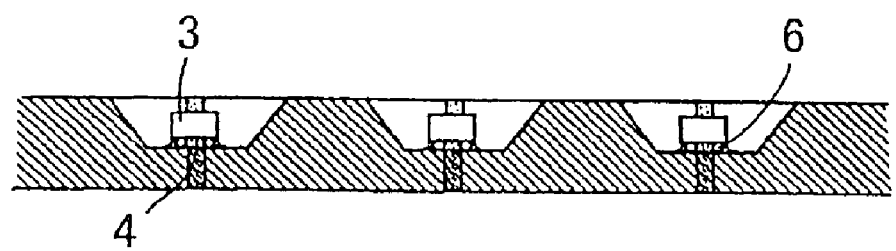
Figure 3F:
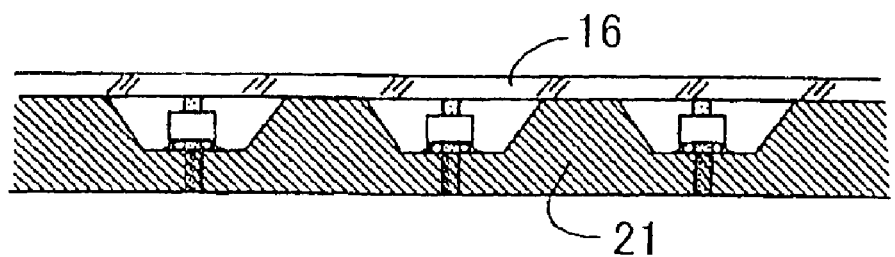

In each area 12, the LED 3 is mounted by the bumps 6 and sealing resin 4 is charged under the LED as shown in FIG. 3e. A transparent sealing plate 16 is adhered on the body assembly 11 as shown in FIG. 3f. Then, each area 12 is divided from the assembly 11, so that the LED device 10 is completed.

Figure 4:
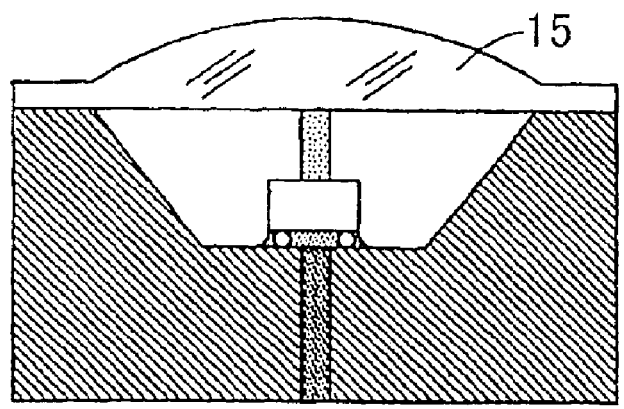
FIG. 4 is a sectional view of a second embodiment of the present invention.

Referring to FIG. 4 showing the second embodiment of the present invention, a transparent sealing plate 15 has a convex lens.

Figure 5:
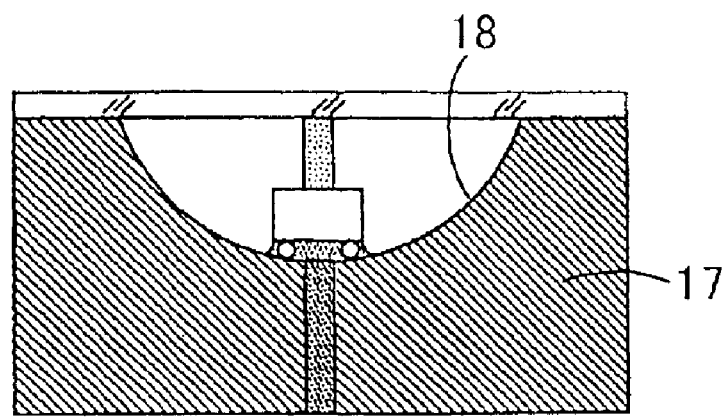
FIG. 5 is a sectional view of a third embodiment of the present invention.
Figure 6:
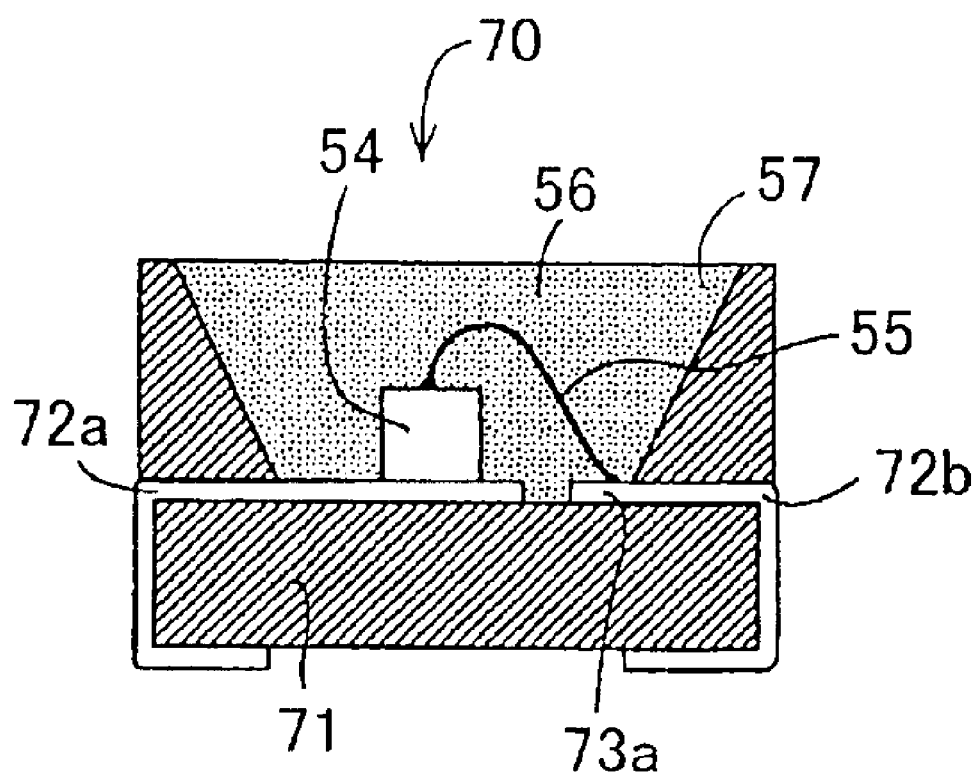
FIG. 6 is a sectional view of a conventional LED device.

FIG. 5 shows the third embodiment. A body 17 has a semispherical recess 18.

While the invention has been described in conjunction with preferred specific embodiment thereof, it will be understood that this description is intended to illustrate and not limit the scope of the invention, which is defined by the following claims.

What is claimed is:

1. A method for manufacturing a light emitting diode device comprising the steps of:

preparing a body assembly having a plurality of LED device areas formed by pressing a metal plate;

forming a recess in each of the LED areas;

forming slits in areas arranged on a predetermined line except both side edges, such that each of the areas is divided into a first half body and a second half body;

charging a resin in each slit, so as to insulate the first half body from the second half body in each of the areas;

mounting an LED on the first and second half body at a bottom of each recess by bumps over the resin in the each slit;

charging a sealing resin under the LED;

securing a transparent sealing plate on the body assembly; and dividing each area from the body assembly.

2. The method according to claim 1 wherein the recess is formed into a semispherical shape.

3. The method according to claim 1 wherein the recess is formed into an inverted truncated cone.

4. The method according to claim 1 wherein the sealing plate is formed as a convex lens.

* * * * *